United States Patent
Wu et al.

(10) Patent No.: US 8,535,495 B2
(45) Date of Patent: Sep. 17, 2013

(54) COATING DEVICE

(75) Inventors: Chia-Ying Wu, Tu-Cheng (TW);
Ming-Yang Liao, Tu-Cheng (TW)

(73) Assignee: Hon Hai Precision Industry Co., Ltd.,
New Taipei (TW)

( * ) Notice: Subject to any disclaimer, the term of this patent is extended or adjusted under 35 U.S.C. 154(b) by 331 days.

(21) Appl. No.: 13/117,163

(22) Filed: May 27, 2011

(65) Prior Publication Data
US 2012/0222957 A1 Sep. 6, 2012

(30) Foreign Application Priority Data

Mar. 1, 2011 (TW) .............................. 100106571 A

(51) Int. Cl.
*C23C 14/34* (2006.01)
*C23C 16/00* (2006.01)

(52) U.S. Cl.
USPC ............ 204/298.15; 204/298.27; 204/298.28; 204/298.29; 118/728; 118/729; 118/730

(58) Field of Classification Search
USPC ............. 204/298.15, 298.27, 298.28, 298.29; 118/728, 729, 730; 269/57, 62
See application file for complete search history.

(56) References Cited

U.S. PATENT DOCUMENTS

| | | | | |
|---|---|---|---|---|
| 4,664,935 A | * | 5/1987 | Strahl | 204/192.1 |
| 5,114,556 A | * | 5/1992 | Lamont, Jr. | 204/192.12 |
| 6,086,727 A | * | 7/2000 | Pinarbasi | 204/192.11 |
| 7,229,532 B2 | * | 6/2007 | Ando et al. | 204/192.12 |
| 8,241,473 B2 | * | 8/2012 | Wang | 204/298.15 |

* cited by examiner

*Primary Examiner* — Rodney McDonald
(74) *Attorney, Agent, or Firm* — Altis Law Group, Inc.

(57) ABSTRACT

A coating device includes a rotatable base, a board for holding workpieces, a positioning shaft positioned on the rotatable base, two eccentric wheels, a rack, and two reciprocating shafts. The two eccentric wheels are fixed on the positioning shaft and extend from the positioning shaft along two opposite directions. The two eccentric wheels are parallel to and spaced from each other. The rack is rotatably connected to the rotatable base. The rack is capable of rotating around the positioning shaft. Each reciprocating shaft is positioned on the rack. Each reciprocating shaft includes a hinge portion rotatably connected to an end of the board and a sliding portion slidably connected to the edge of a corresponding eccentric wheel. The two eccentric wheels are capable of driving the two reciprocating shafts to move alternately toward and away from the positioning shaft along radial directions of the positioning shaft.

9 Claims, 4 Drawing Sheets

COATING DEVICE

BACKGROUND

1. Technical Field

The present disclosure relates to a coating device.

2. Description of Related Art

Generally, in a coating process for workpieces (e.g., lenses), a number of racks are arrayed in a cylindrical magnetron sputtering device to hold a number of workpieces. The racks are positioned on a rotatable board. In the coating process, the racks not only rotate with the rotatable board but also rotate along a corresponding center axis thereof. However, if the rack is too long, a thin coating or no coating at all may be formed on the surfaces of workpieces which are farthest from an evaporative source.

What is needed, therefore, is a coating device capable of overcoming the described limitations.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments.

DETAILED DESCRIPTION

Embodiments of the present disclosure are described in detail as follows, with reference to the accompanying drawings.

Figure 1:
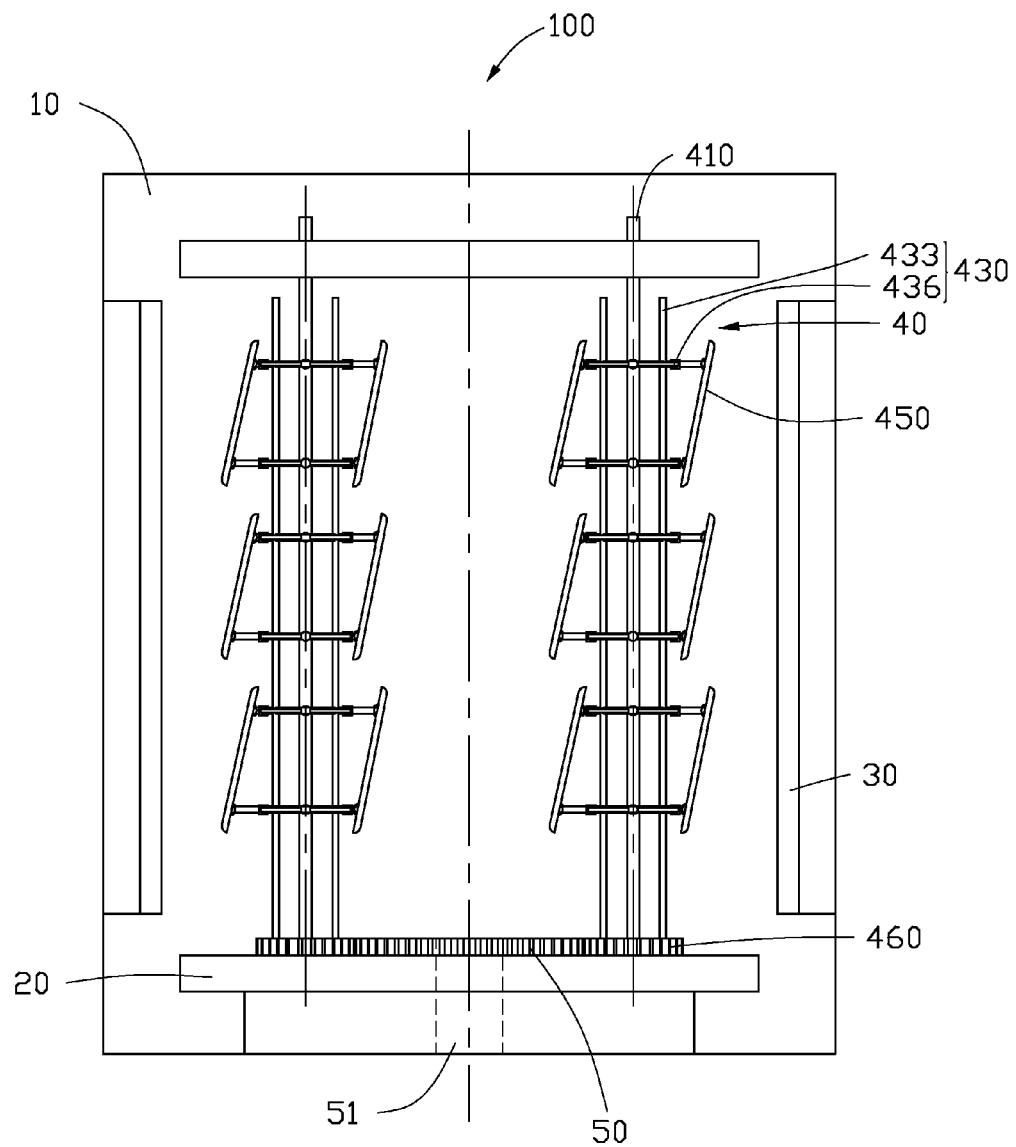
FIG. 1 is a schematic assembled view of a coating device according to an exemplary embodiment, the coating device including holding members.
Figure 2:
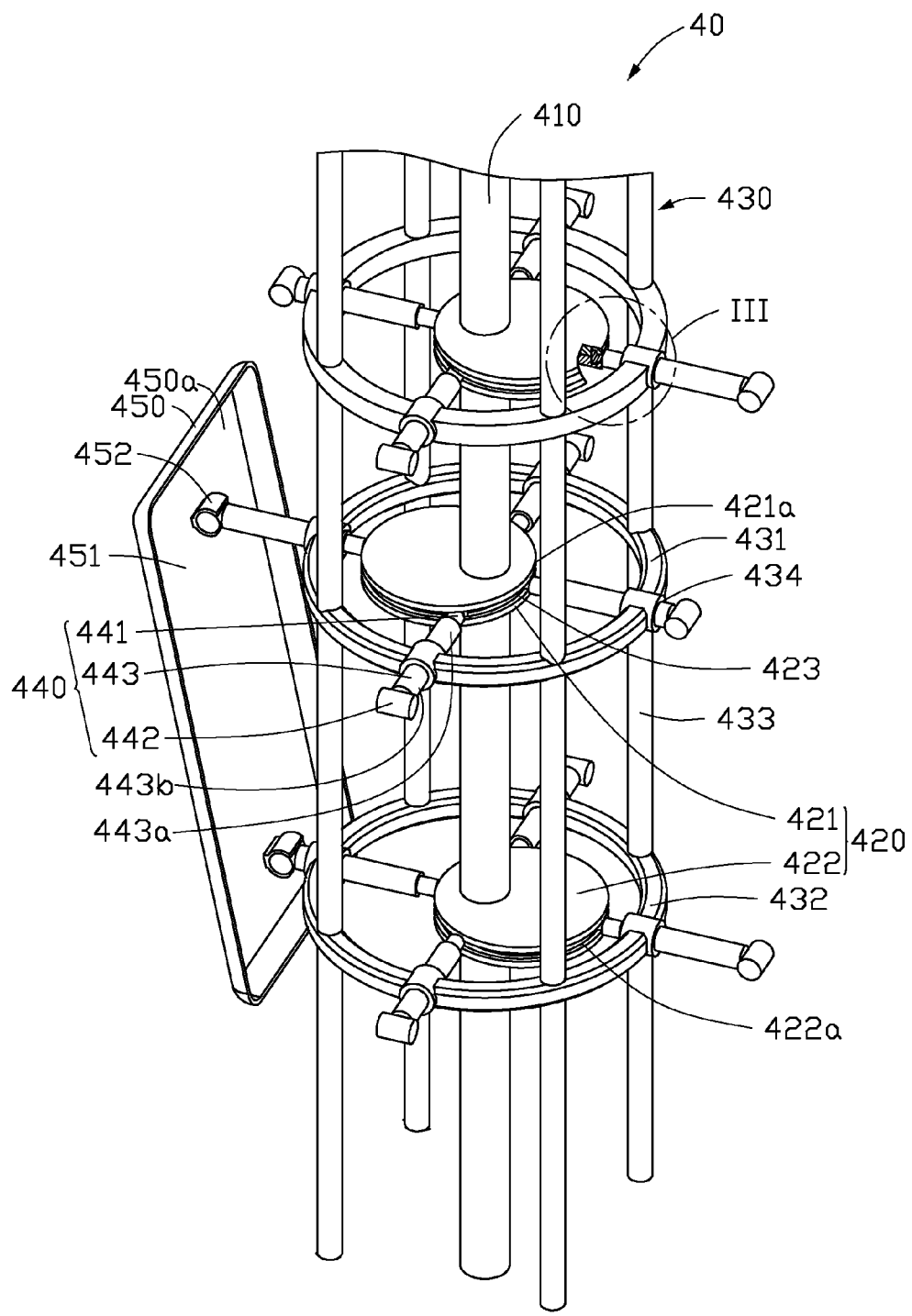
FIG. 2 is a schematic isometric view of one of the holding members of FIG. 1.

Referring to FIGS. 1-2, a coating device 100, according to an exemplary embodiment, includes a chamber 10, a rotatable base 20, a number of targets 30, and a number of holding members 40.

The chamber 10 provides environments that are suitable for depositing films on the substrates (not shown). The rotatable base 20 is rotatably mounted on the bottom of the chamber 10. In the present embodiment, the rotatable base 20 is an annular plate. In other embodiments, the rotatable base 20 can be a polygonal plate.

The targets 30 are fixed in the chamber 10 to vaporize the material. The target 30 surrounds the rotatable base 20.

The holding members 40 are rotatably mounted in close proximity to the circumference of the rotatable base 20. Each holding member 40 includes a positioning shaft 410, a number of pairs of eccentric wheel couples 420, a rack 430, a number of pairs of reciprocating shafts 440, and a number of boards 450.

The positioning shaft 410 is fixed on the rotatable base 20 and parallel to the rotational axis of the rotatable base 20.

Figure 3:
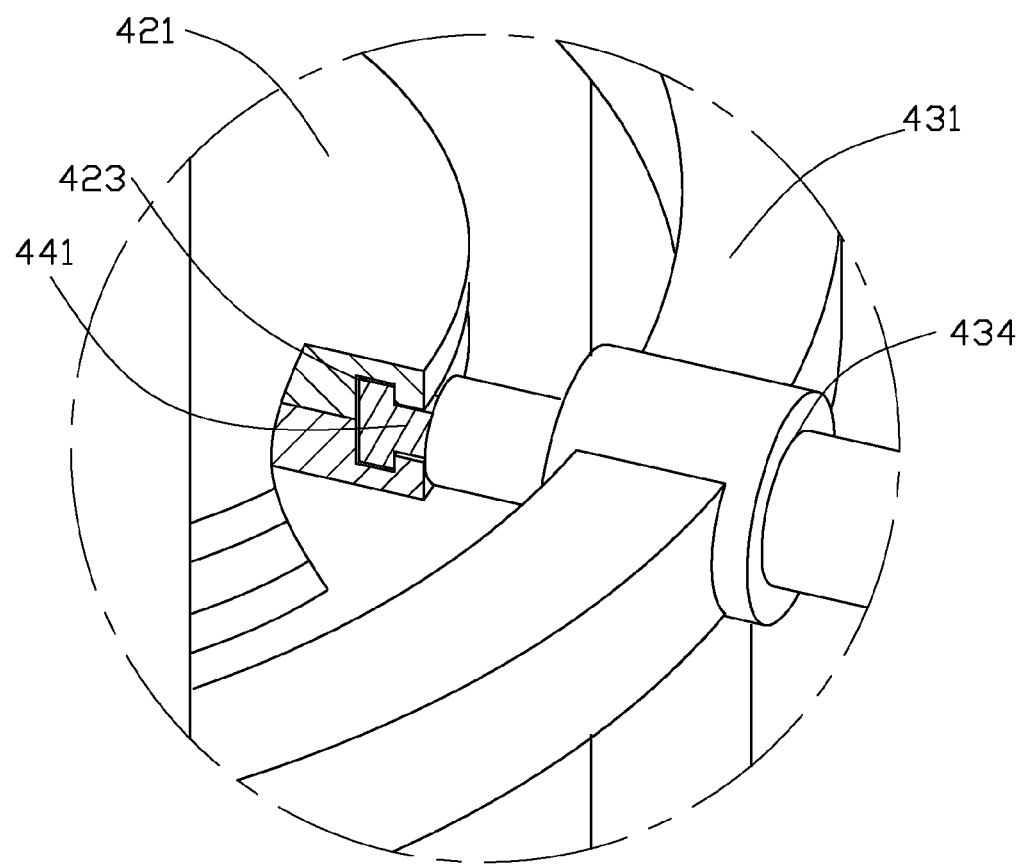
FIG. 3 is an enlarged view of a circled portion III of the holding member of FIG. 2.

Each pair of eccentric wheel couples 420 includes a first eccentric wheel 421 and a second eccentric wheel 422. The first eccentric wheel 421 and the second eccentric wheel 422 are mounted on the positioning shaft 410. The first eccentric wheel 421 and the second eccentric wheel 422 are parallel to and spaced from each other. The first eccentric wheel 421 and the second eccentric wheel 422 extend from the positioning shaft 410 along two opposite directions. The first eccentric wheel 421 and the second eccentric wheel 422 are circular and identical in shape. A circular sliding groove (ring-shaped sliding groove 423) is defined in close proximity to the respective edges 421a, 422a of the first eccentric wheel 421 and the second eccentric wheel 422. In the present embodiment, the ring-shaped sliding groove 423 is T-shaped in section shown in FIG. 3.

Figure 4:
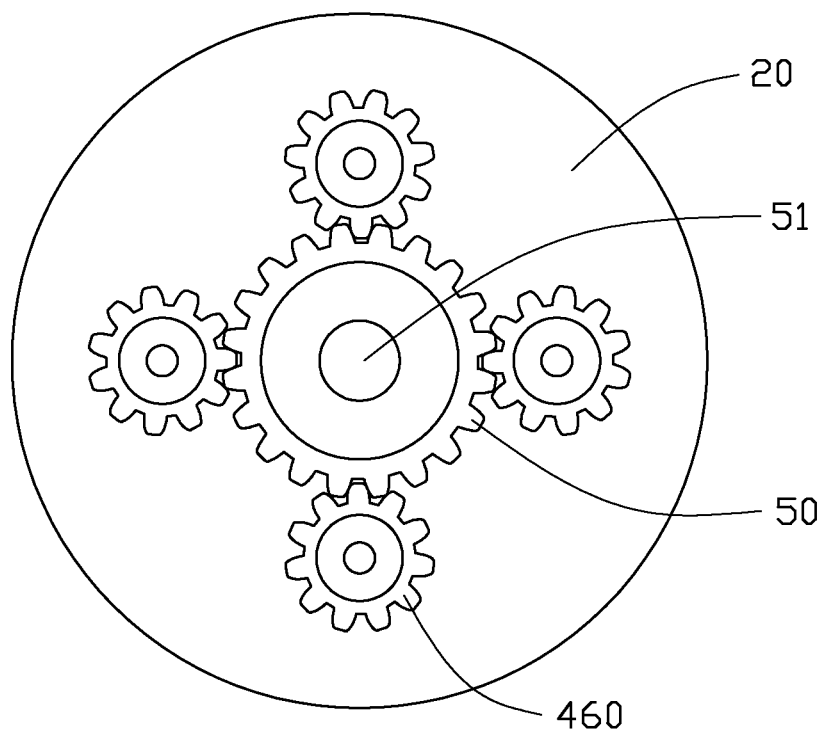
FIG. 4 is a schematic isometric view showing the engagement of a first gear with second gears of the coating device of FIG. 1.

The rack 430 is rotatably connected to the rotatable base 20. The rotational axis of the rack 430 is parallel to that of the rotatable base 20. The rack 430 encompasses the positioning shaft 410 and the eccentric wheel couples 420. The rack 430 can rotate about the positioning shaft 410. In the present embodiment, the coating device 100 includes a first gear 50 and a number of second gears 460 shown in FIG. 4. The first gear 50 is concentrically mounted above the rotatable base 20. The first gear 50 is fixed on the bottom of the chamber 10 by a fixing shaft 51. The second gears 460 are engaged with the first gear 50. Each second gear 460 is mounted at the bottom of a corresponding rack 430. When the rotatable base 20 rotates, all the racks 430 will rotate around the rotational axis of the rotatable base 20, the second gears 460 will rotate around the rotational axis of the rotatable base 20 and be driven by the first gear 50 to rotate around its own axis, and each of the racks 430 will rotate around a corresponding positioning shaft 410 by virtue of a corresponding second gear 460.

The rack 430 includes a number of pairs of rings 436 and a number of connection elements 433. Each pair of rings 436 includes a first ring 431 and a second ring 432. The first ring 431 and the second ring 432 are parallel to and spaced from each other. The connection elements 433 are arranged parallel to each other and connect the first ring 431 and the second ring 432. The first ring 431 and the second ring 432 encompass the first eccentric wheel 421 and the second eccentric wheel 422 respectively. Each of the first ring 431 and the second ring 432 defines a number of holes 434.

Each reciprocating shaft 440 is slidably received in a corresponding ring-shaped sliding groove 423, and passes through a corresponding one of the holes 434. In the present embodiment, the reciprocating shaft 440 is a cylindrical shaft. The reciprocating shaft 440 includes a sliding portion 441, a hinge portion 442, and a shaft body 443 connected between the sliding portion 441 and the hinge portion 442. The sliding portion 441 and the hinge portion 442 are connected to the two opposite ends of the shaft body 443 respectively. The shaft body 443 is received in the corresponding hole 434. The sliding portion 441 is slidably received in the corresponding ring-shaped sliding groove 423. The sliding portion 441 is a T-shaped slide block. The hinge portion 442 is rotatably connected to a corresponding board 450. The hinge portion 442 is a connecting shaft.

Each board 450 is used for holding a number of workpieces. Each board 450 includes two connection portions 452. The two connection portions 452 are positioned on two ends 450a of the board 450. The two connection portions 452 are positioned on a bottom surface 451 of the two ends 450a. The two connection portions 452 are rotatably connected to the two hinge portions 442 of a corresponding pair of reciprocating shafts 440. In the present embodiment, the connection portion 452 is a shaft sleeve with a gap.

In the coating process, each positioning shaft 410 is fixed to the rotatable base 20. The sliding portion 441 of each reciprocating shaft 440 slides in the corresponding ring-shaped sliding groove 423. The rotatable base 20 rotates, all the racks 430 rotate around the rotational axis of the rotatable base 20, and each of the racks 430 rotates about the corresponding positioning shaft 410 by the virtue of the corresponding second gear 460. The first eccentric wheel 421 and the second eccentric wheel 422 of each eccentric wheel couple 420 drive the corresponding pairs of reciprocating shafts 440 to move alternately towards and away from the corresponding positioning shaft 410 along radial directions of the corresponding positioning shaft 410 respectively. The two reciprocating shafts 440 in each pair move in opposite phase to each other. The workpieces held on the two ends 450a of each board 450 can move towards and away from the targets 30 in turn to coat evenly.

While certain embodiments have been described and exemplified above, various other embodiments will be apparent to those skilled in the art from the foregoing disclosure. The present disclosure is not limited to the particular embodiments described and exemplified, and the embodiments are capable of considerable variation and modification without departure from the scope of the appended claims.

What is claimed is:

1. A coating device comprising:
   a rotatable base;
   a board for holding workpieces;
   a positioning shaft positioned on the rotatable base and spaced from a rotational axis of the rotatable base;
   two eccentric wheels fixed on the positioning shaft and extending from the positioning shaft along two opposite directions, the two eccentric wheels being parallel to and spaced from each other;
   a rack rotatably connected to the rotatable base, the rack comprising a first ring and a second ring, the first ring encompassing one of the two eccentric wheels and the positioning shaft, the second ring encompassing another one of the two eccentric wheels and the positioning shaft, the first ring and the second ring being capable of rotating around the positioning shaft; and
   two reciprocating shafts, each reciprocating shaft being positioned on a corresponding one of the first and second rings, each reciprocating shaft comprising a hinge portion and a sliding portion, the hinge portion and the sliding portion being positioned at two opposite ends of each reciprocating shaft, the hinge portion being rotatably connected to an end of the board, the sliding portion being slidably connected to the edge of a corresponding eccentric wheel, the two eccentric wheels being capable of driving the two reciprocating shafts to move alternately toward and away from the positioning shaft along radial directions of the positioning shaft when the first and second rings rotates around the positioning shaft.

2. The coating device as claimed in claim 1, wherein the edge of each eccentric wheel defines a ring-shaped sliding groove, the sliding portion of each reciprocating shaft is slidably received in the ring-shaped sliding groove of a corresponding eccentric wheel.

3. The coating device as claimed in claim 2, wherein the ring-shaped sliding groove is T-shaped in section, the sliding portion is a T-shaped slide block.

4. The coating device as claimed in claim 1, wherein the rack comprises a number of connection elements connecting the first ring and the second ring, each of the first ring and the second ring defines a hole, each reciprocating shaft passes through a corresponding hole.

5. The coating device as claimed in claim 4, wherein the two reciprocating shafts are cylindrical shafts, each reciprocating shaft comprises a shaft body positioned between the hinge portion and the sliding portion, the shaft body is received in a corresponding hole.

6. The coating device as claimed in claim 1, wherein the board comprises two opposite ends and two connection portions, each connection portion is positioned on a corresponding end and rotatably connected to the hinge portion of a corresponding reciprocating shaft.

7. The coating device as claimed in claim 6, wherein the connection portion is a shaft sleeve with a gap, the hinge portion is a connecting shaft.

8. The coating device as claimed in claim 1, further comprising a first gear and a second gear, the first gear rotatably mounted above the center of the rotatable base, the second gear fixed at the bottom of the rack and meshing with the first gear, the second gear rotatably positioned on the rotational base, the second gear driven by the first gear to rotate the rack so as to cause the first ring and the second ring to rotate around the positioning shaft.

9. The coating device as claimed in claim 1, wherein the first eccentric wheel and the second eccentric wheel are circular.

* * * * *